(12) United States Patent
Chen et al.

(10) Patent No.: US 9,373,497 B2
(45) Date of Patent: Jun. 21, 2016

(54) METHODS FOR STRIPPING PHOTORESIST AND/OR CLEANING METAL REGIONS

(71) Applicant: Novellus Systems, Inc., Fremont, CA (US)

(72) Inventors: David Chen, San Jose, CA (US); Haruhiro Harry Goto, Saratoga, CA (US); Martina Su, San Jose, CA (US); Frank Greer, Pasadena, CA (US); Shamsuddin Alokozai, Fremont, CA (US)

(73) Assignee: Novellus Systems, Inc., Fremont, CA (US)

( * ) Notice: Subject to any disclaimer, the term of this patent is extended or adjusted under 35 U.S.C. 154(b) by 6 days.

(21) Appl. No.: 13/759,958

(22) Filed: Feb. 5, 2013

(65) Prior Publication Data

US 2013/0157465 A1 Jun. 20, 2013

Related U.S. Application Data

(63) Continuation of application No. 11/696,633, filed on Apr. 4, 2007, now Pat. No. 8,435,895.

(51) Int. Cl.
| | | |
|---|---|---|
| *C03C 15/00* | (2006.01) | |
| *H01L 21/67* | (2006.01) | |
| *H01L 21/02* | (2006.01) | |
| *H01L 21/311* | (2006.01) | |

(52) U.S. Cl.
CPC .... *H01L 21/02071* (2013.01); *H01L 21/02063* (2013.01); *H01L 21/02074* (2013.01); *H01L 21/31138* (2013.01); *H01L 21/67069* (2013.01)

(58) Field of Classification Search
USPC ............... 438/689, 710–720; 216/58, 67
See application file for complete search history.

(56) References Cited

U.S. PATENT DOCUMENTS

| | | | |
|---|---|---|---|
| 4,201,579 | A | 5/1980 | Robinson et al. |
| 4,357,203 | A | 11/1982 | Zelez |
| 4,699,689 | A | 10/1987 | Bersin |
| 4,961,820 | A | 10/1990 | Shinagawa et al. |
| 5,122,225 | A | 6/1992 | Douglas |
| 5,158,644 | A | 10/1992 | Cheung et al. |
| 5,292,393 | A | 3/1994 | Maydan et al. |
| 5,354,386 | A | 10/1994 | Cheung et al. |
| 5,593,541 | A | 1/1997 | Wong et al. |

(Continued)

FOREIGN PATENT DOCUMENTS

| | | |
|---|---|---|
| CN | 1402316 | 3/2003 |
| CN | 1720349 | 1/2006 |

(Continued)

OTHER PUBLICATIONS

U.S. Appl. No. 13/274,638, filed Oct. 17, 2011, entitled "Photoresist Strip Method for Low-K Dielectrics."

(Continued)

*Primary Examiner* — Nadine Norton
*Assistant Examiner* — Maki Angadi
(74) *Attorney, Agent, or Firm* — Weaver Austin Villeneuve & Sampson LLP

(57) ABSTRACT

Methods are provided for cleaning metal regions overlying semiconductor substrates. A method for removing material from a metal region comprises heating the metal region, forming a plasma from a gas comprising hydrogen and carbon dioxide, and exposing the metal region to the plasma.

20 Claims, 4 Drawing Sheets

(56) References Cited

U.S. PATENT DOCUMENTS

| | | |
|---|---|---|
| 5,626,678 A | 5/1997 | Sahin et al. |
| 5,633,073 A | 5/1997 | Cheung et al. |
| 5,660,682 A | 8/1997 | Zhao et al. |
| 5,707,485 A | 1/1998 | Rolfson et al. |
| 5,767,021 A | 6/1998 | Imai et al. |
| 5,773,201 A | 6/1998 | Fujimura et al. |
| 5,792,269 A | 8/1998 | Deacon et al. |
| 5,811,358 A | 9/1998 | Tseng et al. |
| 5,814,155 A | 9/1998 | Solis et al. |
| 5,817,406 A | 10/1998 | Cheung et al. |
| 5,820,685 A | 10/1998 | Kurihara et al. |
| 5,830,775 A | 11/1998 | Maa et al. |
| 5,844,195 A | 12/1998 | Fairbairn et al. |
| 5,895,272 A | 4/1999 | Li |
| 5,900,351 A | 5/1999 | Lutsic et al. |
| 5,908,672 A | 6/1999 | Ryu et al. |
| 5,911,834 A | 6/1999 | Fairbairn et al. |
| 5,968,324 A | 10/1999 | Cheung et al. |
| 5,980,770 A | 11/1999 | Ramachandran et al. |
| 6,013,574 A | 1/2000 | Hause et al. |
| 6,030,901 A | 2/2000 | Hopper et al. |
| 6,039,834 A | 3/2000 | Tanaka et al. |
| 6,045,618 A | 4/2000 | Raoux et al. |
| 6,054,379 A | 4/2000 | Yau et al. |
| 6,072,227 A | 6/2000 | Yau et al. |
| 6,077,764 A | 6/2000 | Sugiarto et al. |
| 6,083,852 A | 7/2000 | Cheung et al. |
| 6,086,952 A | 7/2000 | Lang et al. |
| 6,098,568 A | 8/2000 | Raoux et al. |
| 6,107,184 A | 8/2000 | Mandal et al. |
| 6,125,788 A | 10/2000 | Hills et al. |
| 6,127,262 A | 10/2000 | Huang et al. |
| 6,129,091 A | 10/2000 | Lee et al. |
| 6,130,166 A | 10/2000 | Yeh |
| 6,156,149 A | 12/2000 | Cheung et al. |
| 6,162,323 A | 12/2000 | Koshimizu |
| 6,171,945 B1 | 1/2001 | Mandal et al. |
| 6,177,347 B1 | 1/2001 | Liu et al. |
| 6,184,134 B1 | 2/2001 | Chaudhary et al. |
| 6,187,072 B1 | 2/2001 | Cheung et al. |
| 6,193,802 B1 | 2/2001 | Pang et al. |
| 6,194,628 B1 | 2/2001 | Pang et al. |
| 6,203,657 B1 | 3/2001 | Collison et al. |
| 6,204,192 B1 | 3/2001 | Zhao et al. |
| 6,209,484 B1 | 4/2001 | Huang et al. |
| 6,230,652 B1 | 5/2001 | Tanaka et al. |
| 6,242,350 B1 | 6/2001 | Tao et al. |
| 6,245,690 B1 | 6/2001 | Yau et al. |
| 6,277,733 B1 | 8/2001 | Smith |
| 6,281,135 B1 | 8/2001 | Han et al. |
| 6,287,990 B1 | 9/2001 | Cheung et al. |
| 6,303,523 B2 | 10/2001 | Cheung et al. |
| 6,306,564 B1 | 10/2001 | Mullee |
| 6,319,842 B1 | 11/2001 | Khosla et al. |
| 6,324,439 B1 | 11/2001 | Cheung et al. |
| 6,340,435 B1 | 1/2002 | Bjorkman et al. |
| 6,342,446 B1 | 1/2002 | Smith et al. |
| 6,348,725 B2 | 2/2002 | Cheung et al. |
| 6,350,701 B1 | 2/2002 | Yamazaki |
| 6,352,936 B1 | 3/2002 | Jehoul et al. |
| 6,358,573 B1 | 3/2002 | Raoux et al. |
| 6,361,707 B1 | 3/2002 | Tanaka et al. |
| 6,365,516 B1 | 4/2002 | Frenkel et al. |
| 6,395,092 B1 | 5/2002 | Sugiarto et al. |
| 6,413,583 B1 | 7/2002 | Moghadam et al. |
| 6,426,304 B1 | 7/2002 | Chien et al. |
| 6,432,830 B1 | 8/2002 | Merry |
| 6,448,187 B2 | 9/2002 | Yau et al. |
| 6,465,964 B1 | 10/2002 | Taguchi et al. |
| 6,511,903 B1 | 1/2003 | Yau et al. |
| 6,511,909 B1 | 1/2003 | Yau et al. |
| 6,517,913 B1 | 2/2003 | Cheung et al. |
| 6,537,422 B2 | 3/2003 | Sakuma et al. |
| 6,537,929 B1 | 3/2003 | Cheung et al. |
| 6,541,282 B1 | 4/2003 | Cheung et al. |
| 6,555,472 B2 | 4/2003 | Aminpur |
| 6,562,544 B1 | 5/2003 | Cheung et al. |
| 6,562,690 B1 | 5/2003 | Cheung et al. |
| 6,569,257 B1 | 5/2003 | Nguyen et al. |
| 6,593,247 B1 | 7/2003 | Huang et al. |
| 6,596,655 B1 | 7/2003 | Cheung et al. |
| 6,632,735 B2 | 10/2003 | Yau et al. |
| 6,638,875 B2 | 10/2003 | Han et al. |
| 6,656,832 B1 | 12/2003 | Pan et al. |
| 6,660,656 B2 | 12/2003 | Cheung et al. |
| 6,660,663 B1 | 12/2003 | Cheung et al. |
| 6,663,715 B1 | 12/2003 | Yuda et al. |
| 6,667,244 B1 | 12/2003 | Cox et al. |
| 6,669,858 B2 | 12/2003 | Bjorkman et al. |
| 6,680,164 B2 | 1/2004 | Nguyen et al. |
| 6,680,420 B2 | 1/2004 | Pang et al. |
| 6,689,930 B1 | 2/2004 | Pang et al. |
| 6,693,043 B1 | 2/2004 | Li et al. |
| 6,709,715 B1 | 3/2004 | Lang et al. |
| 6,720,132 B2 | 4/2004 | Tsai et al. |
| 6,730,593 B2 | 5/2004 | Yau et al. |
| 6,734,115 B2 | 5/2004 | Cheung et al. |
| 6,743,737 B2 | 6/2004 | Yau et al. |
| 6,764,940 B1 | 7/2004 | Rozbicki et al. |
| 6,770,556 B2 | 8/2004 | Yau et al. |
| 6,777,173 B2 | 8/2004 | Chen et al. |
| 6,787,452 B2 | 9/2004 | Sudijono et al. |
| 6,797,188 B1 | 9/2004 | Shen et al. |
| 6,800,571 B2 | 10/2004 | Cheung et al. |
| 6,806,207 B2 | 10/2004 | Huang et al. |
| 6,837,967 B1 | 1/2005 | Berman et al. |
| 6,848,455 B1 | 2/2005 | Shrinivasan et al. |
| 6,858,153 B2 | 2/2005 | Bjorkman et al. |
| 6,869,896 B2 | 3/2005 | Cheung et al. |
| 6,900,135 B2 | 5/2005 | Somekh et al. |
| 6,902,682 B2 | 6/2005 | Shang et al. |
| 6,930,061 B2 | 8/2005 | Cheung et al. |
| 7,023,092 B2 | 4/2006 | Yau et al. |
| 7,070,657 B1 | 7/2006 | Cheung et al. |
| 7,074,298 B2 | 7/2006 | Gondhalekar et al. |
| 7,160,821 B2 | 1/2007 | Huang et al. |
| 7,186,648 B1 | 3/2007 | Rozbicki et al. |
| 7,202,176 B1 | 4/2007 | Goto et al. |
| 7,205,249 B2 | 4/2007 | Cheung et al. |
| 7,227,244 B2 | 6/2007 | Bjorkman et al. |
| 7,256,134 B2 | 8/2007 | Kim et al. |
| 7,288,484 B1 | 10/2007 | Goto et al. |
| 7,297,635 B2 | 11/2007 | Toda et al. |
| 7,344,993 B2 | 3/2008 | Balasubramaniam et al. |
| 7,390,755 B1 | 6/2008 | Chen et al. |
| 7,432,209 B2 | 10/2008 | Delgadino et al. |
| 7,465,680 B2 | 12/2008 | Chen et al. |
| 7,468,326 B2 | 12/2008 | Chen et al. |
| 7,556,712 B2 | 7/2009 | Yi et al. |
| 7,560,377 B2 | 7/2009 | Cheung et al. |
| 7,569,492 B1 | 8/2009 | Chen et al. |
| 7,585,777 B1 | 9/2009 | Goto et al. |
| 7,595,005 B2 | 9/2009 | Balasubramaniam |
| 7,597,816 B2 | 10/2009 | Chang et al. |
| 7,601,272 B2 | 10/2009 | Nguyen et al. |
| 7,628,864 B2 | 12/2009 | Moriya et al. |
| 7,651,949 B2 | 1/2010 | Jo |
| 7,740,768 B1 | 6/2010 | Goto et al. |
| 8,034,176 B2 | 10/2011 | Tsukamoto et al. |
| 8,058,178 B1 | 11/2011 | Goto et al. |
| 8,058,181 B1 | 11/2011 | Chen et al. |
| 8,097,527 B2 | 1/2012 | Yang |
| 8,129,281 B1 | 3/2012 | Cheung et al. |
| 8,173,547 B2 | 5/2012 | Winniczek et al. |
| 8,193,096 B2 | 6/2012 | Goto et al. |
| 8,435,895 B2 | 5/2013 | Chen et al. |
| 8,444,869 B2 | 5/2013 | Goto et al. |
| 8,591,661 B2 | 11/2013 | Cheung et al. |
| 8,598,037 B2 | 12/2013 | Winniczek et al. |
| 8,641,862 B2 | 2/2014 | Goto et al. |
| 8,716,143 B1 | 5/2014 | Cheung et al. |
| 8,721,797 B2 | 5/2014 | Cheung et al. |
| 2001/0014529 A1 | 8/2001 | Chen et al. |
| 2001/0027023 A1 | 10/2001 | Ishihara |

(56) References Cited

U.S. PATENT DOCUMENTS

| | | |
|---|---|---|
| 2002/0000202 A1 | 1/2002 | Yuda et al. |
| 2002/0005392 A1 | 1/2002 | Luo et al. |
| 2002/0039625 A1 | 4/2002 | Powell et al. |
| 2002/0045331 A1 | 4/2002 | Aminpur |
| 2002/0072016 A1 | 6/2002 | Chen et al. |
| 2002/0078976 A1 | 6/2002 | Nguyen |
| 2002/0081854 A1 | 6/2002 | Morrow et al. |
| 2002/0090827 A1 | 7/2002 | Yokoshima |
| 2002/0111041 A1 | 8/2002 | Annapragada et al. |
| 2002/0132486 A1 | 9/2002 | Williams et al. |
| 2002/0139775 A1 | 10/2002 | Chang et al. |
| 2002/0185151 A1 | 12/2002 | Qingyuan et al. |
| 2002/0185226 A1 | 12/2002 | Lea et al. |
| 2002/0187643 A1 | 12/2002 | Gu et al. |
| 2002/0197870 A1 | 12/2002 | Johnson |
| 2003/0036284 A1 | 2/2003 | Chou et al. |
| 2003/0045115 A1 | 3/2003 | Fang |
| 2003/0045131 A1 | 3/2003 | Verbeke et al. |
| 2004/0084412 A1 | 5/2004 | Waldfried et al. |
| 2004/0237997 A1* | 12/2004 | Rui et al. .................. 134/1.1 |
| 2004/0245091 A1 | 12/2004 | Karim et al. |
| 2004/0248414 A1 | 12/2004 | Tsai et al. |
| 2005/0079723 A1 | 4/2005 | Niimi et al. |
| 2005/0106888 A1 | 5/2005 | Chiu et al. |
| 2005/0158667 A1 | 7/2005 | Nguyen et al. |
| 2005/0196967 A1 | 9/2005 | Savas et al. |
| 2006/0046482 A1 | 3/2006 | Verhaverbeke |
| 2006/0102197 A1 | 5/2006 | Chiang et al. |
| 2006/0138399 A1 | 6/2006 | Itano et al. |
| 2006/0154471 A1 | 7/2006 | Minami |
| 2006/0163202 A1 | 7/2006 | Shimizu |
| 2006/0182875 A1 | 8/2006 | Ose et al. |
| 2006/0191478 A1 | 8/2006 | Gondhalekar et al. |
| 2006/0201623 A1 | 9/2006 | Yoo |
| 2006/0289384 A1 | 12/2006 | Pavel et al. |
| 2007/0037396 A1 | 2/2007 | Verhaverbeke |
| 2007/0040172 A1 | 2/2007 | Kawakami et al. |
| 2007/0068900 A1 | 3/2007 | Kim et al. |
| 2007/0144673 A1 | 6/2007 | Yeom |
| 2007/0173066 A1 | 7/2007 | Kokura et al. |
| 2007/0178698 A1 | 8/2007 | Okita et al. |
| 2007/0224826 A1 | 9/2007 | Delgadino et al. |
| 2007/0235137 A1 | 10/2007 | Tsukamoto et al. |
| 2007/0281491 A1 | 12/2007 | Kamp |
| 2008/0026589 A1 | 1/2008 | Hubacek et al. |
| 2008/0044995 A1 | 2/2008 | Kang et al. |
| 2008/0102646 A1 | 5/2008 | Kawaguchi et al. |
| 2008/0160729 A1 | 7/2008 | Krueger et al. |
| 2008/0248656 A1 | 10/2008 | Chen et al. |
| 2008/0286697 A1 | 11/2008 | Verhaverbeke et al. |
| 2009/0053901 A1 | 2/2009 | Goto et al. |
| 2009/0056875 A1 | 3/2009 | Goto et al. |
| 2009/0061623 A1 | 3/2009 | Chang et al. |
| 2009/0200268 A1 | 8/2009 | Tappan et al. |
| 2009/0221148 A1 | 9/2009 | Uda et al. |
| 2009/0277871 A1 | 11/2009 | Berry et al. |
| 2010/0015812 A1 | 1/2010 | Nishikawa |
| 2010/0062591 A1 | 3/2010 | Lin et al. |
| 2010/0216312 A1 | 8/2010 | Yamamoto et al. |
| 2010/0308463 A1 | 12/2010 | Yu et al. |
| 2011/0006034 A1 | 1/2011 | Hilkene et al. |
| 2011/0139175 A1 | 6/2011 | Cheung et al. |
| 2011/0139176 A1 | 6/2011 | Cheung et al. |
| 2011/0143548 A1 | 6/2011 | Cheung et al. |
| 2012/0211462 A1 | 8/2012 | Zhang et al. |
| 2012/0211473 A1 | 8/2012 | Goto et al. |
| 2013/0048014 A1 | 2/2013 | Shaviv et al. |
| 2014/0080309 A1 | 3/2014 | Park et al. |
| 2014/0120733 A1 | 5/2014 | Cheung et al. |
| 2014/0182619 A1 | 7/2014 | Goto et al. |

FOREIGN PATENT DOCUMENTS

| | | |
|---|---|---|
| CN | 1868043 | 11/2006 |
| CN | 101015042 | 8/2007 |
| CN | 101131928 | 2/2008 |
| EP | 0 304 068 | 2/1989 |
| EP | 1 077 476 | 2/2001 |
| EP | 1081754 | 7/2001 |
| JP | 2001-308078 | 11/2001 |
| JP | 2003-264170 | 9/2003 |
| JP | 2007/019367 | 1/2007 |
| JP | 2007-53344 | 3/2007 |
| JP | 2007-266610 | 10/2007 |
| TW | 387097 | 4/2000 |
| WO | WO 2004/051702 | 6/2004 |
| WO | WO 2005/017983 | 2/2005 |
| WO | WO 2006/028858 | 3/2006 |
| WO | 2011/071980 | 6/2011 |
| WO | 2011/072042 | 6/2011 |
| WO | 2011/072061 | 6/2011 |
| WO | WO 2012/018375 | 2/2012 |

OTHER PUBLICATIONS

U.S. Appl. No. 13/370,689, filed Feb. 10, 2012, entitled "Plasma Based Photoresist Removal System for Cleaning Post Ash Residue".

U.S. Appl. No. 13/590,083, filed Aug. 20, 2012, entitled "Photoresist Strip Processes for Improved Device Integrity".

US Office Action, dated Jul. 27, 2005, issued in U.S. Appl. No. 10/890,653.

US Final Office Action, dated Jan. 10, 2006, issued in U.S. Appl. No. 10/890,653.

US Office Action, dated Jun. 26, 2006, issued in U.S. Appl. No. 10/890,653.

US Office Action, dated Oct. 11, 2006, issued in U.S. Appl. No. 10/890,653.

US Office Action, dated Apr. 5, 2007, issued in U.S. Appl. No. 10/890,653.

US Notice of Allowance, dated Jun. 15, 2007, issued in U.S. Appl. No. 10/890,653.

US Office Action, dated Oct. 6, 2008, issued in U.S. Appl. No. 11/859,727.

US Notice of Allowance, dated May 1, 2009, issued in U.S. Appl. No. 11/859,727.

US Office Action, dated Nov. 5, 2010, issued in U.S. Appl. No. 12/533,461.

US Final Office Action, dated May 26, 2011, issued in U.S. Appl. No. 12/533,461.

US Notice of Allowance, dated Aug. 12, 2011, issued in U.S. Appl. No. 12/533,461.

US Notice of Allowance, dated Nov. 28, 2006, issued in U.S. Appl. No. 11/011,273.

US Office Action, dated Dec. 23, 2008, issued in U.S. Appl. No. 11/712,253.

US Office Action, dated Jul. 17, 2009, issued in U.S. Appl. No. 11/712,253.

US Final Office Action, dated Jan. 29, 2010, issued in U.S. Appl. No. 11/712,253.

US Office Action, dated Mar. 1, 2011, issued in U.S. Appl. No. 11/712,253.

US Office Action, dated Nov. 2, 2011, issued in U.S. Appl. No. 12/251,305.

US Notice of Allowance, dated Feb. 17, 2012, issued in U.S. Appl. No. 12/251,305.

US Office Action, dated Jul. 11, 2003, issued in U.S. Appl. No. 10/137,096.

US Final Office Action, dated Jul. 27, 2007, issued in U.S. Appl. No. 10/137,096.

US Notice of Allowance, issued in mailed Jan. 15, 2008, issued in U.S. Appl. No. 10/137,096.

US Office Action, dated Aug. 25, 2008, issued in U.S. Appl. No. 12/111,095.

US Notice of Allowance, dated Apr. 3, 2009, issued in U.S. Appl. No. 12/111,095.

(56) References Cited

OTHER PUBLICATIONS

US Office Action, dated Dec. 8, 2010, issued in U.S. Appl. No. 12/502,130.
US Notice of Allowance, dated Aug. 12, 2011, issued in U.S. Appl. No. 12/502,130.
US Office Action, dated Sep. 6, 2012, issued in U.S. Appl. No. 12/636,582.
US Office Action, dated Mar. 30, 2012, issued in U.S. Appl. No. 12/636,601.
US Final Office Action, dated Sep. 5, 2012, issued in U.S. Appl. No. 12/636,601.
US Office Action, dated Jul. 27, 2012, issued in U.S. Appl. No. 12/963,503.
Notice of Allowance, dated Feb. 17, 2010, issued in U.S. Appl. No. 11/548,801.
US Office Action, dated Nov. 10, 2011, U.S. Appl. No. 12/786,230.
US Final Office Action, dated Apr. 26, 2012, issued in U.S. Appl. No. 12/786,230.
US Office Action, dated Sep. 13, 2006, issued in U.S. Appl. No. 11/128,930.
US Final Office Action, dated Mar. 8, 2007, issued in U.S. Appl. No. 11/128,930.
US Office Action, dated Mar. 19, 2007, issued in U.S. Appl. No. 11/128,930.
US Office Action, dated Jun. 29, 2007, issued in U.S. Appl. No. 11/128,930.
US Office Action, Dec. 10, 2007, issued in U.S. Appl. No. 11/128,930 dated.
US Final Office Action, dated Jul. 21, 2008, issued in U.S. Appl. No. 11/128,930.
US Office Action, dated Mar. 20, 2009, issued in U.S. Appl. No. 11/128,930.
US Office Action, dated Sep. 17, 2009, issued in U.S. Appl. No. 11/128,930.
US Office Action, dated Feb. 26, 2010, issued in U.S. Appl. No. 11/128,930.
US Final Office Action, dated Sep. 9, 2010, issued in U.S. Appl. No. 11/128,930.
US Office Action, dated May 10, 2011, issued in U.S. Appl. No. 11/128,930.
US Notice of Allowance, dated Oct. 28, 2011, issued in U.S. Appl. No. 11/128,930.
US Office Action, dated Dec. 15, 2009, issued in U.S. Appl. No. 11/696,633.
US Office Action, dated May 26, 2010, issued in U.S. Appl. No. 11/696,633.
US Final Office Action, dated Sep. 20, 2010, issued in U.S. Appl. No. 11/696,633.
US Office Action, dated Jun. 6, 2011, issued in U.S. Appl. No. 11/696,633.
US Final Office Action, dated Sep. 28, 2011, issued in U.S. Appl. No. 11/696,633.
US Office Action, dated Jan. 27, 2012, issued in U.S. Appl. No. 11/696,633.
US Final Office Action, dated May 15, 2012, issued in U.S. Appl. No. 11/696,633.
Notice of Allowance, dated Oct. 29, 2012, issued in U.S. Appl. No. 11/696,633.
PCT International Search Report and Written Opinion, dated Jun. 27, 2011, issued in Application No. PCT/US2010/059388.
PCT International Search Report and Written Opinion, dated Jul. 13, 2011, issued in Application No. PCT/US2010/059547.
PCT International Search Report and Written Opinion, dated Jul. 14, 2011, issued in Application No. PCT/US2010/059517.
Singapore Written Opinion and Search Report, dated Feb. 2, 2012, issued in Application No. 201104086-2.
Singapore Second Written Opinion, dated Aug. 7, 2012, issued in Application No. 201104086-2.
Japanese Office Action mailed Sep. 25, 2012, issued in Application No. 2009-018046.
Chinese Office Action mailed Jul. 20, 2012, issued in Application No. 200810187894.4.
Kikuchi et al. (1994) "Native Oxide Removal on Si Surfaces by NF3-Added Hydrogen and Water Vapor Plasma Downstream Treatment," Jpn J. Appl. Phys. vol. 33, pp. 2207-2211, Part 1, No. 4B, Apr. 1994.
Woody K. Chung, (1990) "Downstream Plasma Removal of Mobile Ion Impurity From $SIO_2$," *Published Proceedings of the 8th International Plasma Processing SymposiuM*, Fall, 7 pages.
Woody K, Chung, (1989) "Low Damage, Downstream RF Plasma Ashing of High Energy, Heavily Doped Implanted Resists," Semicon Korea.
A. Kalnitsky and W. K. Chung, "Characterization and Optimization of a Single Wafer Downstream Plasma Stripper," *Journal of the Electrochemical Society*, vol. 135, No. 9, pp. 2338-2341.
S. Wolf and R.N. Tauber, (1986) (Silicon Processing for the VLSI Era, vol. 1—Process Technology, Lattice Press), pp. 539-543.
U.S. Appl. No. 14/301,155, filed Jun. 10, 2014, entitled "Peroxide-Vapor Treatment for Enhancing Photoresist-Strip Performance and Modifying Organic Films."
US Office Action dated Feb. 15, 2013, U.S. Appl. No. 13/274,638.
US Office Action, dated Apr. 26, 2013, issued in U.S. Appl. No. 13/462,660.
US Notice of Allowance, dated Sep. 30, 2013, issued in U.S. Appl. No. 13/462,660.
US Notice of Allowance, dated Dec. 31, 2013, issued in U.S. Appl. No. 13/462,660.
US Final Office Action, dated May 13, 2013, issued in U.S. Appl. No. 12/636,582.
US Advisory Action Before the Filing of an Appeal Brief, dated Sep. 20, 2013, issued in U.S. Appl. No. 12/636,582.
US Office Action, dated Dec. 4, 2013, issued in U.S. Appl. No. 12/636,582.
US Office Action, dated Feb. 12, 2013, issued in U.S. Appl. No. 12/636,601.
US Notice of Allowance, dated Jul. 23, 2013, issued in U.S. Appl. No. 12/636,601.
US Supplemental Notice of Allowability, dated Nov. 5, 2013, issued in U.S. Appl. No. 12/636,601.
US Office Action, dated Apr. 10, 2014, issued in U.S. Appl. No. 14/066,587.
US Final Office Action, dated Jan. 22, 2013, issued in U.S. Appl. No. 12/963,503.
US Office Action, dated Aug. 23, 2013, issued in U.S. Appl. No. 12/963,503.
US Notice of Allowance, dated Feb. 12, 2014, issued in U.S. Appl. No. 12/963,503.
US Notice of Allowance dated Jan. 24, 2013, issued in U.S. Appl. No. 12/786,230.
US Office Action dated Feb. 22, 2013, issued in U.S. Appl. No. 13/370,689.
US Final Office Action dated Aug. 20, 2013, issued in U.S. Appl. No. 13/370,689.
US Notice of Allowance dated Jan. 17, 2014, issued in U.S. Appl. No. 13/370,689.
Chinese Office Action dated Jun. 19, 2013, issued in Application No. 200810187894.4.
Japanese Description of details of Reasons for Rejection dated Oct. 9, 2012, issued in Application No. 2009-018046.
Japanese Summary of Reasons for Rejection dated Sep. 3, 2013, issued in Application No. 2009-018046.
Taiwan Search Report dated Feb. 17, 2014 issued in TW 097146496.
PCT International Preliminary Report on Patentability and Written Opinion, dated Jun. 21, 2012, issued in Application No. PCT/US2010/059388.
PCT International Preliminary Report on Patentability and Written Opinion, dated Jun. 21, 2012, issued in Application No. PCT/US2010/059517.
Singapore Written Opinion, dated Jul. 15, 2013, issued in Application No. 201204092-9.
PCT International Preliminary Report on Patentability and Written Opinion, dated Jun. 21, 2012, issued in Application No. PCT/US2010/059547.

(56) References Cited

OTHER PUBLICATIONS

Singapore Written Opinion dated Aug. 1, 2013 issued in Application No. 201203361-9.
Singapore Second Written Opinion dated Apr. 5, 2014 issued in Application No. 201203361-9.
European Partial Search Report dated Apr. 17, 2013 issued in Application No. 12 18 1659.
European Partial Search Report dated Aug. 19, 2013 issued in Application No. 12 18 1659.
Singapore Search Report and Written Opinion dated Dec. 13, 2013 issued in SG 201206236-0.
Abe et al. (Aug. 2003) "Novel photoresist stripping technology using ozone/vaporized water mixture," IEEE Trans. Semicon. Manufact., 16(3):401-408.
De Gendt et al. (1999) "A Novel Resist and Post-Etch Residue Removal Process Using Ozonated Chemistry," Solid State Phenomena vols. 65-66:165-168.
Ghandhi, Sorab K., (1983) "VLSI Fabrication Principles," by John Wiley & Sons, Inc., pp. 517-520.
Noda et al. (2003) "Development of a Photoresist Removal Method Using Ozone Gas with Water Vapor for LCD Manufacturing," J. Electrochem. Soc. 150(9):G537-G542.

\* cited by examiner

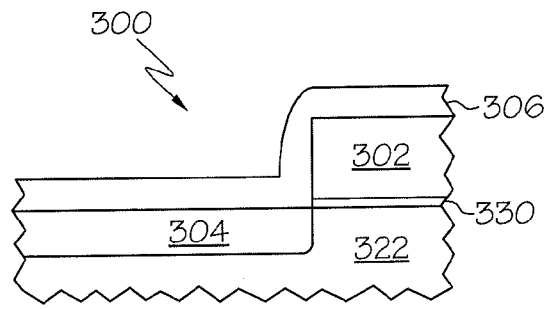
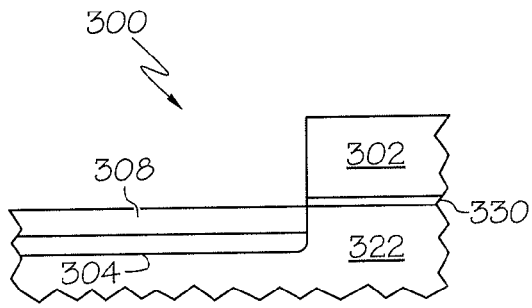
FIG. 5   FIG. 6
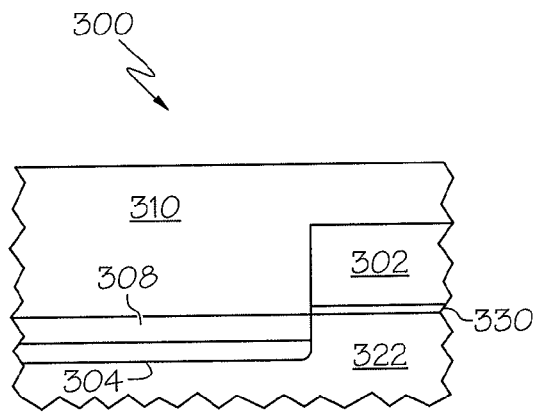
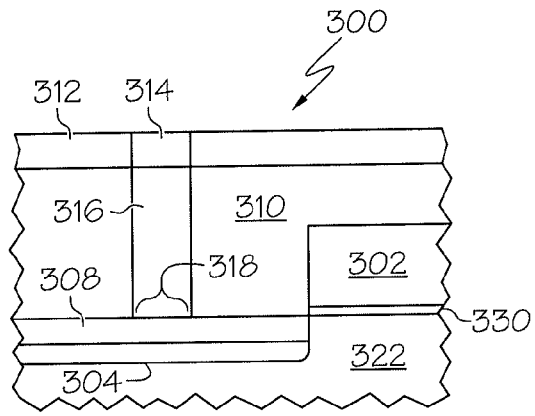
FIG. 7   FIG. 8
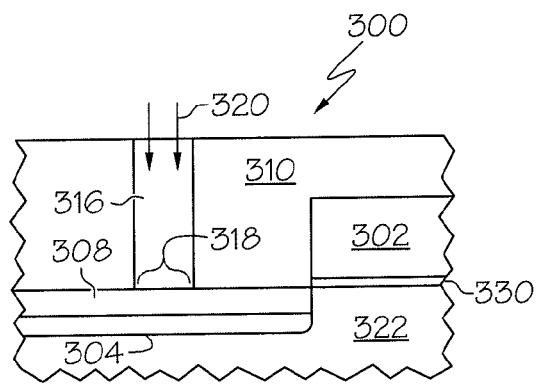
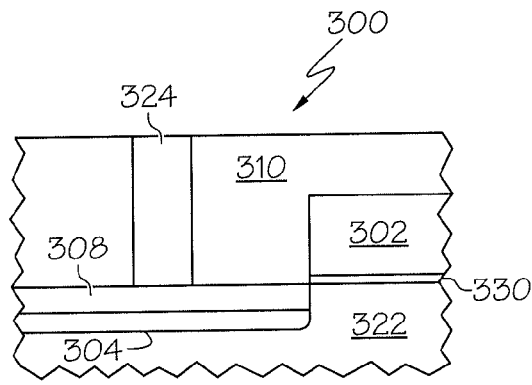
FIG. 9   FIG. 10

US 9,373,497 B2

METHODS FOR STRIPPING PHOTORESIST AND/OR CLEANING METAL REGIONS

CROSS-REFERENCE TO RELATED APPLICATION

This application is a continuation of and claims priority from U.S. patent application Ser. No. 11/696,633, filed Apr. 4, 2007, titled "METHODS FOR STRIPPING PHOTORESIST AND/OR CLEANING METAL REGIONS," all of which is incorporated herein by this reference for all purposes.

FIELD OF THE INVENTION

The present invention generally relates to semiconductor fabrication, and more particularly relates to methods for stripping photoresist and/or cleaning metal or metal silicide regions of semiconductor structures.

BACKGROUND OF THE INVENTION

Electrical interconnect techniques typically require electrical connection between metal or other conductive layers, or regions, which are present at different elevations within or overlying a semiconductor substrate. Such interconnecting typically is conducted, in part, by etching a trench and/or a contact opening through insulating material to a lower elevation metal layer or metallized region. For example, contact openings commonly are fabricated to make conductive contact to a metal silicide region of a metal-oxide-semiconductor field effect transistor (MOSFET). Trenches and contact openings also are conventionally fabricated to various metal layers to ultimately connect one semiconductor device element on one elevation to another semiconductor device element on another elevation.

Typically, as part of the process for fabricating a contact opening, a photoresist layer is deposited on the insulating material. The photoresist is patterned and etched to expose portions of the insulating layer and transfer the pattern to the insulating layer. The insulating layer is etched to the lower metal layer or region (hereinafter referred to collectively as "metal region"), forming a contact opening within the insulating layer to the metal region. The photoresist then is stripped from the insulating layer and a conductive material is deposited within the contact opening.

During the etching of the contact opening and the subsequent stripping of the photoresist, however, etching residue such as polymer from the photoresist can settle onto the exposed lower metal region. In addition, the metal region can be oxidized by exposure to oxygen in the environment. Some small resistance is associated with each contact between a conductor formed within the contact opening and a metal region. However, etching residue and metal oxide on the metal region increase that resistance, thereby decreasing device performance. Various methods have been used and suggested for cleaning the metal region after formation of the contact opening and before deposition of the conductive material within the contact opening. For example, ionized argon typically has been used to clean the metal region. However, ionized argon can result in sputtering of the metal region. Oxygen-based plasma also has been used, but oxygen-based plasma results in oxidation of the metal region. To reduce contact resistance and enhance device performance, the semiconductor industry is transitioning from cobalt silicide ($CoSi_2$) to nickel silicide (NiSi) for MOSFET contacts. However, NiSi is quickly oxidized by oxygen plasma to form nickel oxide, which greatly increases the resistivity of the contact. The use of hydrogen-containing plasma has been suggested to clean the metal region. However, the use of hydrogen-containing plasma can be slower and less efficient than desired.

Accordingly, it is desirable to provide improved methods for stripping photoresist and/or cleaning metal regions of semiconductor structures. It is also desirable to provide stripping and/or cleaning methods that do not result in sputtering or oxidation of the metal regions. In addition, it is desirable to provide methods for stripping photoresist and/or cleaning metal regions at enhanced stripping and cleaning rates. It also is desirable to provide methods for fabricating semiconductor structures utilizing such stripping and cleaning methods. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein:

FIGS. 5-10 illustrate, in cross-section, a method for fabricating a semiconductor structure in accordance with an exemplary embodiment of the present invention.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
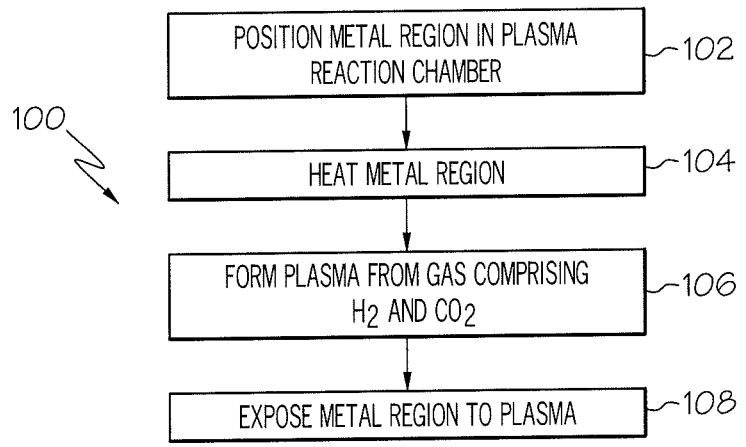
FIG. 1 is a flowchart of a method for stripping a photoresist and/or cleaning a metal region in accordance with an exemplary embodiment of the present invention.

In accordance with an exemplary embodiment of the present invention, a method 100 for stripping a photoresist and/or cleaning a metal layer or a metal region is illustrated in FIG. 1. It will be understood that the method can be used to clean a metal layer, such as a metal wire or interconnect, upon which has formed an undesirable oxide layer or other contaminants. In addition, the method can be used to clean a metal layer or metal region, such as a metal silicide region, to which a contact opening is made through an overlying material layer, such as an insulating layer, with the use of a patterned photoresist. During the etching of the overlying material layer, polymer from the photoresist and other contaminants may deposit on the subsequently exposed metal layer or region. In addition, with the exposure to the ambient, the metal layer or region may be oxidized. Method 100 is used to remove metal oxide and other residue and contaminants from the metal layer or region without the simultaneous oxidizing or sputtering of the metal layer or region. While method 100 can be used solely to clean the metal layer or region, it can also be used to simultaneously remove the overlying photoresist, Alternatively, method 100 can be used solely to remove the overlying photoresist. For the sake of brevity, the term "metal regions" will be used hereinafter to refer collectively to metal layers, metal wires, metal interconnects, and other metal regions, such as metal silicide regions.

Figure 2:
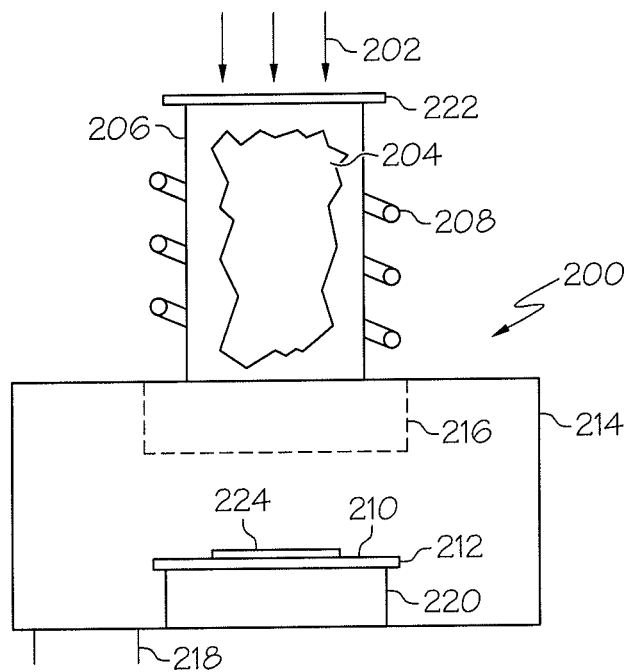
FIG. 2 is a cross-sectional view of a remote plasma reaction chamber suitable for use with the method illustrated in FIG. 1.

The method 100 begins by positioning the metal region in a plasma reaction chamber apparatus (step 102). Preferably, the plasma reaction chamber apparatus is a remote (downstream) plasma reaction chamber apparatus. FIG. 2 is a simplified cross-sectional illustration of a conventional apparatus 200 used for remote plasma exposure. However, it will be appreciated by those skilled in the art that other forms of plasma chambers may be used to practice the various embodiments of the present invention, including direct (in situ plasma) plasma reaction chamber apparatuses. Examples of suitable apparatuses are the Novellus Gamma® 2100 and Gamma® 2130 systems, which are multi-station sequential processing systems that include photoresist stripping stations and plasma reaction chambers in one apparatus, the Novellus Inova® NexT integrated metal deposition system, which is a single wafer multi-chamber system, and the Novellus Sequel® and Vector® dielectric deposition systems, which also are multi-station sequential processing systems. In apparatus 200, a plasma 204 is created by direct excitation of molecular gas, indicated by arrows 202, flowing through a quartz tube 206 with an inductive coil 208 encircling it. RE power is applied to the coil 208 creating atomic, ionized, and excited gas species. The plasma is essentially confined to the quartz tube. A metal region 210, typically formed overlying a substrate 212, such as a semiconductor substrate, is positioned in a processing chamber 214 downstream from the center of the coil 208 such that the metal region 210 is not exposed directly to the plasma. The processing chamber 214 may be separated from the quartz tube by a gas distribution plate 216, otherwise known as a showerhead, that is configured to distribute the plasma evenly over substrate 212. The processing chamber 214 includes a substrate support pedestal 220 and tow pressure is maintained within the processing chamber by a vacuum pump via conduit 218.

As noted above, the metal region typically is formed overlying a substrate 212, such as a semiconductor substrate. The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. The substrate may be a bulk silicon wafer, or may be a thin layer of silicon on an insulating layer (commonly known as silicon-on-insulator or SOI) that, in turn, is supported by a carrier wafer. The metal region may be disposed on or within the semiconductor substrate or may overlie the semiconductor substrate with various insulating, metal, and semiconductor layers disposed therebetween. A photoresist 224 may overlie an insulating layer disposed on the semiconductor substrate and exposing the metal region.

The substrate 212 is placed on the substrate support pedestal 220 and gas 202 is supplied to the quartz tube 206 through one or more entry ports 222. The gas 202 comprises hydrogen and carbon dioxide ($CO_2$). In this regard, gas 202 comprises $CO_2$ in an amount sufficient to increase the cleaning rate of plasma 204 but less than an amount that would result in substantial oxidation of the metal region 210. While $CO_2$ comprises oxygen, the formation of metal oxide occurs at a much slower rate than if $O_2$ is a component of gas 202. In one embodiment of the invention, $CO_2$ is present in an amount no less than 0.1% and no greater than 10% of gas 202. In a preferred embodiment of the invention, $CO_2$ is present in an amount of no less than 0.1% and no greater than 5%. In a more preferred embodiment of the invention, $CO_2$ is present in an amount no less than 0.1% and no greater than 1%.

Method 100 may be implemented for any size substrate or semiconductor wafer. Most modern wafer fabrication facilities use either 200 mm or 300 mm wafers. Process conditions of method 100 may vary depending on the wafer size. Referring to FIGS. 1 and 2, during the plasma process, the substrate 212 is heated by a resistive heater (not shown) within the pedestal 220 to a steady state temperature (step 104), thereby heating metal region 210. In an exemplary embodiment, the substrate 212 is heated or adjusted to and maintained at a temperature in the range of about 200° C. and 450° C. In another exemplary embodiment, the temperature of the substrate 212 is heated or otherwise adjusted to and maintained at a temperature in the range of about 270° C. to about 350° C. The pressure within processing chamber 214 may range, for example, from 1 mTorr to 5 Torr. Preferably, the pressure ranges from 0.9 Torr to 1.1 Torr. Before, during or after heating of the substrate 212, RF power is supplied to the coil 208 to form plasma 204 from the gas 202 (step 106). The RF power supplied to the coil is sufficient to maintain a stable plasma within the quartz tube for the duration of the plasma process. In an exemplary embodiment, the RF power is in the range of about 100 Watts to about 5000 Watts. The gas 202 (or the components thereof) flow through entry port(s) 222 at a rate sufficient to provide a substantially constant supply of gas from which to form the plasma. In an exemplary embodiment, if a 300 mm wafer is used, the flow rate of the gas 202 is in the range of about 100 standard cubic centimeters per minute (seem) to about 100,000 seem. The flow rate of carbon dioxide will be in the range of 1 seem and about 5000 seem.

The metal region 210 then is exposed to the plasma (step 108). If present, the photoresist 224 also is exposed to the plasma. Substrate 212 may be temperature controlled and/or an RF bias may be applied. Upon production of the plasma, atomic, ionized, and excited H, $H_2$, CO, and $CO_2$ species flow from the plasma and interact with photoresist 224 and with the residue and oxide on the metal region 210. Showerhead 216, which is grounded, terminates the flow of some ions due to recombination and allows the flow of neutral species into processing chamber 214. The photoresist is converted to volatile hydrocarbon compounds that are desorbed from the insulating layer upon which it is disposed. The residue and any oxide on the surface of the metal region also are converted by the plasma to volatile species that are desorbed from the surface with minimal or no sputtering of the metal region and minimal or no oxidation of the metal region.

Figure 3:
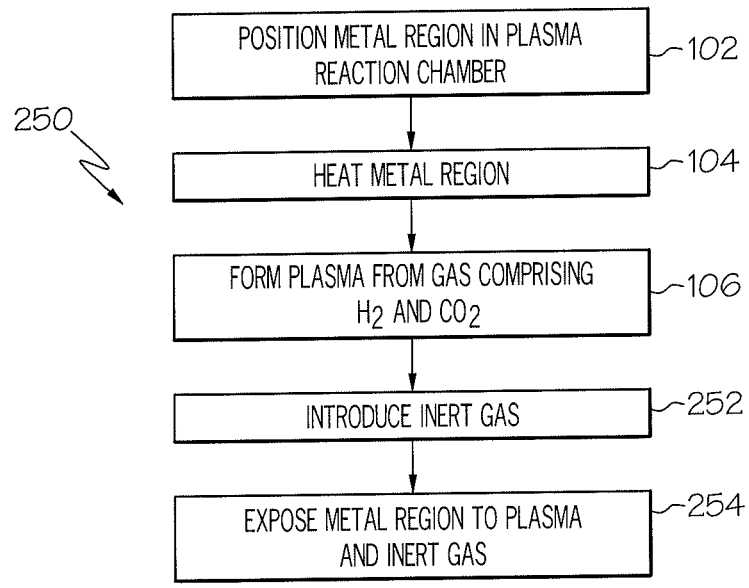
FIG. 3 is a flowchart of a method for stripping a photoresist and/or cleaning a metal region in accordance with another exemplary embodiment of the present invention.

In accordance with another exemplary embodiment of the present invention, a method 250 for stripping a photoresist and/or cleaning a metal region is illustrated in FIG. 3. As with method 100, method 250 can be used to clean a metal layer, such as a metal wire or interconnect, upon which has formed an undesirable oxide layer or other contaminants. In addition, the method can be used to clean a metal layer or metal region, such as a conductive via or a metal silicide region to which a contact opening is made through an overlying material layer, such as an insulating layer, with the use of a patterned photoresist. While method 250 can be used solely to clean the metal region, it also can be used to simultaneously remove an overlying photoresist. Alternatively, method 250 can be used solely to remove the overlying photoresist. Method 250 is similar to method 100 but, as described below, method 250 includes the step of introducing an inert gas to a remote plasma reaction chamber apparatus. The inert gas is introduced upstream from the metal region but downstream from the region of the apparatus where the plasma is formed. In this regard, the required hydrogen flow rate can be reduced while the photoresist strip rate and the metal region clean rate are maintained.

Figure 4:
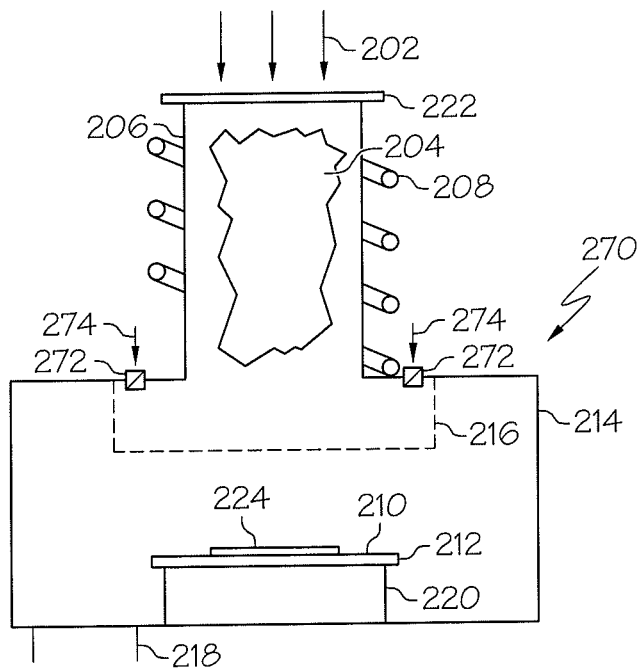
FIG. 4 is a cross-sectional view of a remote plasma reaction chamber suitable for use with the method illustrated in FIG. 3.

The method 250 begins as does method 100 with the step of positioning the metal region in a remote plasma reaction chamber apparatus (step 102). FIG. 4 is a simplified cross-sectional illustration of a remote plasma reaction chamber apparatus 270 suitable to practice method 250. Plasma reaction chamber apparatus 270 is similar to plasma reaction chamber apparatus 200; however, apparatus 270 comprises at least one inert gas inlet 272. Inert gas inlet 272 is downstream of the area of the apparatus where the plasma is formed, i.e., quartz tube 206, and is upstream from showerhead 216 and substrate support pedestal 220.

As described above with reference to method 100, the substrate 212 having metal region 210, and optionally photoresist 224, is placed on the substrate support pedestal 220 and gas 202 is supplied to the quartz tube 206 through entry port 222. The gas 202 comprises hydrogen and carbon dioxide. As described above, gas 202 comprises $CO_2$ in an amount sufficient to increase the cleaning rate of plasma 204 but less than an amount that would result in substantial oxidation of the metal region 210. While $CO_2$ comprises oxygen, the formation of metal oxide occurs at a much slower rate than if $O_2$ is a component of gas 202. In one embodiment of the invention, $CO_2$ is present in an amount no less than 0.1% and no greater than 10% of the total gas in the chamber, that is, $H_2$, $CO_2$, and the inert gas, described below. In a preferred embodiment of the invention, $CO_2$ is present in an amount no less than 0.1% and no greater than 5%. In more preferred embodiment of the invention, $CO_2$ is present in an amount no less than 0.1% and no greater than 1%.

Method 250 may be implemented for any size substrate or semiconductor wafer and process conditions of method 250 may vary depending on the wafer size. Referring to FIGS. 3 and 4, during the plasma process, the substrate 212 is heated by a resistive heater (not shown) within the pedestal 220 to a steady state temperature (step 104), thereby heating metal region 210. In an exemplary embodiment, the substrate 212 is heated or adjusted to and maintained at a temperature in the range of about 200° C. and 450° C. In another exemplary embodiment, the temperature of the substrate 212 is heated or otherwise adjusted to and maintained at a temperature in the range of about 270° C. to about 350° C. The pressure within processing chamber 214 may range, for example, from 1 mTorr to 5 Torr. Preferably, the pressure ranges from 0.9 Torr to 1.1 Torr. Before, during or after heating of the substrate 212, RF power is supplied to the coil 208 to form plasma 204 from the gas 202 (step 106). The RF power supplied to the coil is sufficient to maintain a stable plasma within the quartz tube for the duration of the plasma process. In an exemplary embodiment, the RF power is in the range of about 100 Watts to about 5000 Watts. The gas 202 (or the components thereof) flow through entry port 222 at a rate sufficient to provide a substantially constant supply of gas from which to form the plasma. In an exemplary embodiment, if a 300 mm wafer is used, the flow rate of the gas 202 is in the range of about 100 sccm to about 100,000 sccm. The flow rate of carbon dioxide will be in the range of 1 sccm and about 5000 sccm.

An inert gas, illustrated by arrows 274, is introduced via gas inlet 272 upstream of the showerhead 216 and downstream from where plasma 204 is formed (step 252). Gas inlet 272 may be any type of gas inlet and may include multiple ports or jets to optimize mixing the inert gas with the plasma. The inert gas 274 may comprise, for example, argon (Ar) or helium (He). In a preferred embodiment, the inert gas comprises argon. The inert gas flow rate into processing chamber 214 is in the range of about 1 to about 20 times the hydrogen flow rate. In a preferred embodiment, the inert gas flow rate is in the range of about 19 to about 20 times the hydrogen flow rate. The inert gas mixes with the plasma 204. Showerhead 216 directs the plasma/inert gas mixture into processing chamber 214. Showerhead 216, which is grounded, terminates the flow of some ions by recombination and allows the flow of neutral species into processing chamber 214. Substrate 212 may be temperature controlled and/or an RF bias may be applied.

The metal region 210 then is exposed to the plasma/inert gas mixture (step 254). If present, the photoresist 224 also is exposed to the plasma/inert gas mixture. Atomic, ionized, and excited H, $H_2$, CO, and $CO_2$ species flow from the plasma and interact with the photoresist and the residue and oxide on the metal region 210. The photoresist is converted to volatile hydrocarbons that are desorbed from the insulating layer upon which it is disposed. The residue and oxide also are converted by the plasma to volatile species that are desorbed from the metal region with minimal or no sputtering of the metal region and minimal or no oxidation of the metal region.

In some embodiments of the present invention, the apparatus does not include showerhead 216. In these embodiments, the inert gas inlets 272 introduce the inert gas directly into the processing chamber 214 where it mixes with the plasma upstream of substrate 212.

FIGS. 5-10 illustrate a method for fabricating a semiconductor structure 300 using cleaning method 100 or cleaning method 250 in accordance with exemplary embodiments of the present invention. For purposes of illustration, semiconductor structure 300 is a MOSFET device to be formed on and within a silicon substrate. However, it will be appreciated that the various embodiments of cleaning method 100 and cleaning method 250 are not limited to the fabrication of MOSFET devices but can be used for the fabrication of any semiconductor structure having metal regions from which oxides, polymer residues, and/or other contaminants are to be removed. Various steps in the manufacture of MOSFETs are well known and so, in the interest of brevity, many conventional steps will only be mentioned briefly herein or will be omitted entirely without providing the well known process details.

Referring to FIG. 5, a MOSFET gate electrode 302 is disposed overlying a silicon substrate 322, similar to semiconductor substrate 212 illustrated in FIGS. 2 and 4, with a gate insulator 330 disposed therebetween. Those of skill in the art will appreciate that semiconductor structure 300 may include a large number of such gate electrodes 302 as required to implement a desired circuit function. The initial steps in the fabrication of gate electrode 302 are conventional so the structure resulting from these steps is illustrated in FIG. 5, but the initial steps themselves are not shown. Although the term "MOSFET" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

A surface portion 304 of the substrate 322 is doped with P-type conductivity determining impurities for the fabrication of an n-channel MOSFET or with N-type conductivity determining impurities for the fabrication of P-channel MOS- FET. Portion 304 can be impurity doped, for example, by the implantation and subsequent thermal annealing of dopant ions such as boron and arsenic.

In accordance with an exemplary embodiment of the invention, a layer 306 of a silicide-forming metal is deposited over the structure and in contact with the exposed portion 304. The silicide-forming metal typically comprises cobalt, nickel, rhenium, ruthenium, palladium or any other suitable metal and is deposited to a thickness in the range of about 5 nm to about 20 nm. The silicide-forming metal can be deposited, for example, by plasma vapor deposition (PVD) or electrochemical deposition.

Referring to FIG. 6, the method continues with the heating of the structure, for example by rapid thermal annealing (RTA), to cause the silicide-forming metal 306 to react with the silicon to form a metal silicide 308 at the surface of the exposed portion 304. Silicide forms only in those areas where there is exposed silicon in contact with the silicide-forming metal. Silicide does not form, and the silicide-forming metals remain unreacted, in those areas where there is no exposed silicon such as on the sidewalls of metal gate electrode 302. The unreacted silicide-forming metal can be removed by wet etching in a $H_2O_2/H_2SO_4$, $HNO_3/HCl$, or aqua regia ($H_2O$, HCl, and $HNO_3$) solution. A blanket layer of insulating material 310 is deposited overlying the semiconductor structure 300, as illustrated in FIG. 7. The insulating material can be, for example, a silicon oxide-based material or a polymer and can be deposited by chemical vapor deposition (CVD), low pressure chemical vapor deposition (LPCVD), plasma enhanced chemical vapor deposition (PECVD), or the like.

In accordance with an exemplary embodiment of the present invention, the method continues with photo lithographically patterning and etching the insulating material layer 310 to expose a portion of metal silicide 308. In this regard, a photoresist 312 is formed overlying the insulating material layer 310 and is patterned by conventional photolithography processing to form an opening 314, as illustrated in FIG. 8. The photoresist 312 can be any photoresist polymer utilized in semiconductor technology and can be patterned using conventional lithography methods such as, for example, 1-line or deep UV lithography. The insulating material layer 310 then is etched to form a contact opening 316 that extends through the insulating material layer to expose a portion 318 of metal silicide 308. The insulating layer 310 can be etched by, for example, reactive ion etching (RIE) using a fluorine-based chemistry.

Referring to FIG. 9, after forming the contact opening 316, the photoresist 312 is stripped and the exposed portion 318 of metal silicide 308 is cleaned using method 100 or method 250 described above to remove any polymer deposited during removal of the photoresist and any other oxides and contaminants that may have formed or deposited on portion 318 during etching of insulating layer 310 and removal of photoresist 312. The photoresist may be stripped simultaneously with the cleaning of the exposed portion 318 or may be stripped prior to cleaning of exposed portion 318. The semiconductor structure 300 is disposed within a plasma reaction chamber and the semiconductor substrate 322 is heated or adjusted to and maintained at a temperature, for example, in the range of about 200° C. and 450° C., preferably at a temperature in the range of about 270° C. and 350° C. As described above, a plasma is created from a gas comprising hydrogen and $CO_2$. The exposed portion 318 of metal silicide 308 is subjected to the plasma, indicated by arrows 320 and, if using cleaning method 250, to inert gas to remove the polymer residue, oxides, and contaminants from the metal silicide 308. Any of the processing parameters described above for cleaning methods 100 and 250 can be used to clean exposed portion 318 using the respective method.

A thin layer of a first conductive material, such as a barrier layer, typically is deposited within contact opening 316 followed by deposition of a second conductive material, such as tungsten or copper or an alloy thereof, to form a conductive contact to metal silicide 308. Accordingly, semiconductor structure 300 can be moved to another processing chamber, such as a PVD or CVD chamber, within which the conductive material can be deposited. However, during transition of semiconductor structure 300 between processing apparatuses, such as during the transition from a photoresist stripping tool to a PVD system, semiconductor structure 300 may be exposed to an ambient environment. Exposure to the ambient environment may result in re-oxidation of the exposed metal silicide portion along with the deposition of other contaminants. In addition, semiconductor structure 300 may be stored for a period of time, during which oxides may form and other contaminants may deposit. To remove such contamination before deposition of the conductive material, structure 300 again can be cleaned using cleaning method 100 or cleaning method 250 as described above. The cleaning method can be performed in a standalone plasma clean chamber and the semiconductor structure 300 can be protected from the environment during transition to a deposition chamber, or the method can be performed in a multi-chamber apparatus having a deposition chamber and a plasma clean chamber. Thus, cleaning method 100 or cleaning method 250 can be performed as a "post-clean" after formation of contact opening 316 and as a "pre-clean" before deposition of conductive material within contact opening 316. Referring to FIG. 10, after cleaning of portion 318 of metal silicide 308, conductive material layer(s) can be deposited within contact opening 316 to form a conductive contact 324 to metal silicide 308. Any excess conductive material formed on insulating material layer 310 can be removed by an etching process or more typically by chemical mechanical planarization (CMP).

FIGS. 11-16 illustrate a method for fabricating a semiconductor structure 350 using cleaning method 100 or cleaning method 250 in accordance with exemplary embodiments of the present invention. For purposes of illustration, semiconductor structure 350 is a metal interconnect structure. However, it will be appreciated that the various embodiments of cleaning method 100 and cleaning method 250 are not limited to the fabrication of metal interconnect structures but can be used for the fabrication of any semiconductor structure having metal regions from which oxides, polymer residues, and/or other contaminants are to be removed. Various steps in the manufacture of metal interconnect structures are well known and so, in the interest of brevity, many conventional steps will only be mentioned briefly herein or will be omitted entirely without providing the well known process details.

Figure 11:
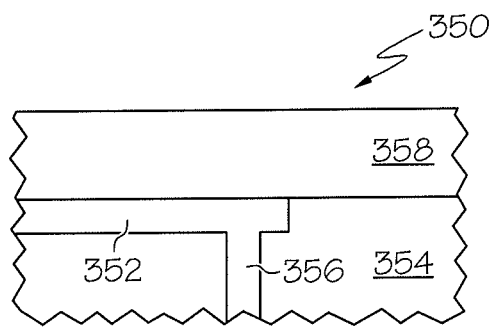
FIGS. 11-16 illustrate, in cross-section, a method for fabricating a semiconductor structure in accordance with another exemplary embodiment of the present invention.

Referring to FIG. 11, the method begins by providing a semiconductor structure 350 with a first metal interconnect 352, such as a metal wire or contact trace, that is disposed within a first insulating layer 354. First metal interconnect 352 may comprise any suitable metal such as, for example, aluminum, copper, gold, tungsten, titanium, or alloys thereof, or a combination of metal layers. First insulating layer 354 may be formed of any suitable dielectric material such as, for example, silicon dioxide, spin-on glass, carbon-doped silicon oxide, silicon carbide, or the like. Metal interconnect 352 may be electrically coupled to a semiconductor device, another metal interconnect or wire, or the like by, for example, a first conductive via 356. First conductive via 358 may comprise any suitable metal, such as aluminum, copper, gold, tungsten, titanium or alloys thereof or a combination of metal layers. A second insulating layer 358 is disposed on first metal interconnect 352 and first insulating layer 354. Second insulating layer 358 may comprise any of the insulating materials of which first insulating layer 354 is formed.

Figure 12:
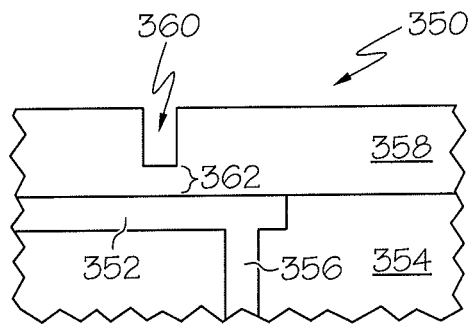
Figure 13:
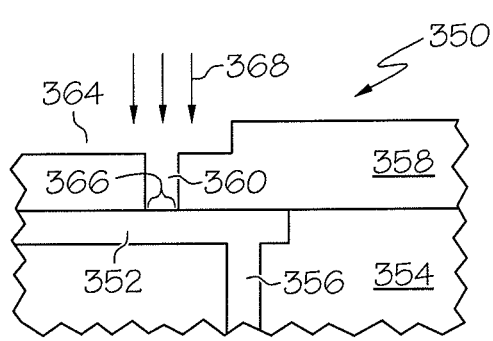

Referring to FIG. 12, a partial via or opening 360 is etched by conventional photolithography within second insulating layer 358 and overlying first metal interconnect 352, leaving a barrier layer or portion 362 of second insulating layer 358 between partial via 360 and first metal interconnect 352. As described above, partial via 360 may be etched by first depositing a first photoresist (not shown) and then patterning the first photoresist by conventional lithography methods. Second insulating layer 358 can be etched by, for example, RIE using a fluorine-based chemistry. The first photoresist then can be removed by, for example, using any of the embodiments of method 100 or method 250 described above or by conventional ashing methods. As illustrated in FIG. 13, after etching of partial via 360, a trench 364 is etched within second insulating layer 358 and above via 360. During etching of trench 364, the portion 362 between partial via 360 and first interconnect 352 also may be etched, exposing a region 366 of first interconnect 352. Trench 364 may be etched by depositing a second photoresist (not shown) and patterning the second photoresist by conventional lithography methods. Second insulating layer 358 can be etched by, for example, RIE using a fluorine-based chemistry. If portion 362 is not removed during etching of trench 364, it can be subsequently removed by further etching. The second photoresist is then removed.

Simultaneously with the removal of the second photoresist or, alternatively, after the second photoresist is removed, the exposed region 366 of first metal interconnect 352 can be cleaned as described above using any of the embodiments described above for method 100 or method 250 to remove any photoresist residue, oxides or other contaminants that may have formed or deposited on exposed region 366. In this regard, the semiconductor structure 350 is disposed within a plasma clean chamber on the support pedestal of the plasma reaction chamber and the pedestal is heated or adjusted to and maintained at a temperature in the range of about 200° C. and 450° C., preferably at a temperature in the range of about 270° C. and 350° C. As described above, a plasma is created from a gas comprising hydrogen and $CO_2$. The exposed region 366 of first metal interconnect 352 is subjected to the plasma, indicated by arrows 368 and, if using cleaning method 250, to inert gas to remove oxides and contaminants from region 366. Any of the processing parameters described above for cleaning methods 100 and 250 can be used to clean region 366 using the respective method.

Figure 14:
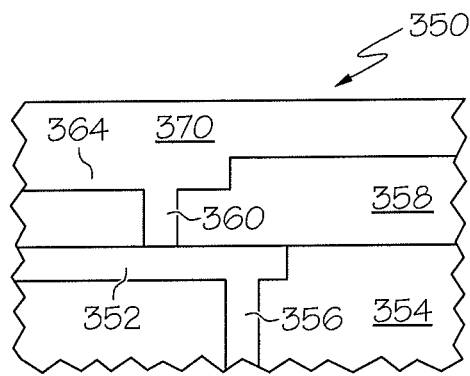
Figure 15:
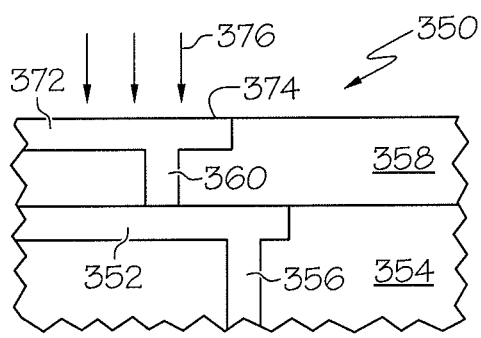

The semiconductor structure 350 then can be positioned within a deposition apparatus such as, for example, the Novellus INOVA® XT apparatus, for deposition of a conductive material within trench 364 and via 360. However, prior to deposition of the conductive material, exposed region 366 again may be cleaned using any of the embodiments described above for method 100 or method 250 to remove any oxides or other contaminates that may have formed or deposited on exposed region 366 during transfer of semiconductor structure 350 and storage thereof. A blanket layer of conductive material 370 then is deposited within via 360 and trench 364 in electrical contact with first metal interconnect 352 and overlying second insulating layer 358, as illustrated in FIG. 14. Conductive layer 370 may be formed of any suitable conductive material such as, for example, aluminum, copper, gold, tungsten, titanium or alloys thereof or a combination of metal layers. For example, conductive layer 370 may be formed of a tantalum or tantalum/tantalum nitride barrier layer and a copper seed layer, both formed by PVD, and a copper fill layer deposited by electroplating. Referring to FIG. 15, excess conductive material of conductive layer 370 disposed outside of via 360 and trench 364 then may be removed by, for example, dry or wet etching or CMP to form second interconnect 372.

The method continues, in accordance with an exemplary embodiment of the invention, with a cleaning of a surface 374 of second interconnect 372 using any of the above-described embodiments of method 100 or method 250 to remove any oxides or other contaminants that may have formed or deposited on surface 374. The semiconductor structure 350 is disposed within a plasma clean chamber on the support pedestal of the plasma clean chamber and the pedestal is heated or adjusted to and maintained at a temperature in the range of about 200° C. and 450° C., preferably at a temperature in the range of about 270° C. and 350° C. As described above, a plasma is created from a gas comprising hydrogen and $CO_2$. The exposed surface 374 of second interconnect 374 is subjected to the plasma, indicated by arrows 376 and, if using cleaning method 250, to inert gas to remove oxides and contaminants from surface 374. Any of the processing parameters described above for cleaning methods 100 and 250 can be used to clean surface 374 using the respective method.

Figure 16:
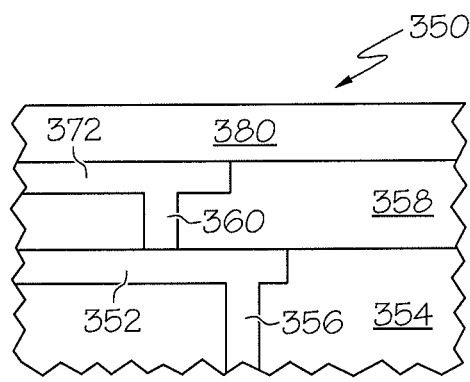

Referring to FIG. 16, after cleaning of surface 374 of second interconnect 372, a third insulating layer 380 is formed overlying second interconnect 372 and second insulating layer 358. Third insulating layer 380 typically comprises a dielectric diffusion barrier/etch stop layer such as, for example, silicon carbide (SiC) or silicon nitride (SiN) and an overlying interlevel dielectric layer such as silicon dioxide, carbon-doped silicon oxide, and the like. Suitable systems for performing the above-described cleaning methods 100 and 250 followed by the formation of insulating layer 380 are the Novellus Sequel® and Vector® systems. The process may continue with the formation and cleaning of a third interconnect or with the formation of any other suitable device.

Accordingly, methods for stripping photoresist and/or cleaning a metal region have been provided. The methods utilize a plasma formed from a gas comprising hydrogen and $CO_2$. The presence of the $CO_2$ increases the cleaning speed of the plasma without oxidizing the metal region or damaging the metal region by sputtering. An inert gas may be mixed with the plasma to reduce the required hydrogen flow rate while maintaining the photoresist strip rate and the metal region clean rate. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for removing material from a metal region overlying a semiconductor substrate, the method comprising:
   forming a plasma from a gas comprising hydrogen and carbon dioxide; and
   exposing the metal region to the plasma to thereby remove material from the metal region of the semiconductor substrate.

2. The method of claim 1, further comprising heating the metal region to a temperature in a range of about 200° C. to about 450° C.

3. The method of claim 2, wherein the temperature is in a range of about 270° C. and 350° C.

4. The method of claim 1, wherein the plasma is formed from gas comprising hydrogen and about 0.1% to about 10% carbon dioxide.

5. The method of claim 4, wherein the plasma is formed gas comprising hydrogen and about 0.1% to about 1% carbon dioxide.

6. The method of claim 1, wherein the plasma is a remote plasma.

7. The method of claim 1, wherein the plasma is an in situ plasma.

8. The method of claim 1, wherein the metal region is a metal silicide region.

9. The method of claim 8, the metal silicide region is a nickel silicide region.

10. The method of claim 1, wherein the metal region comprises a metal interconnect.

11. The method of claim 1, wherein exposing the metal region to the plasma comprises exposing the metal region to the plasma and an inert gas.

12. The method of claim 11, further comprising introducing the inert gas upstream from the metal region, wherein the inert gas has a flow rate in a range of about 0.15 and 25 times a flow rate of the hydrogen.

13. The method of claim 1, wherein a polymeric material is removed.

14. A method for cleaning a metal region overlying a semiconductor substrate, the method:

exciting a gas, wherein the gas comprises hydrogen and carbon dioxide; and subjecting the metal region to the excited gas to thereby clean the metal region of the semiconductor substrate.

15. The method of claim 14, wherein the gas comprises about 0.1% by volume to about 10% by volume carbon dioxide.

16. The method of claim 14, wherein exciting the gas comprises exciting the gas upstream from a chamber in which the semiconductor substrate is disposed.

17. The method of claim 16, further comprising introducing an inert gas upstream from the semiconductor substrate, and wherein subjecting the metal region to the excited gas comprises subjecting the metal region to the excited gas and the inert gas.

18. The method of claim 14, wherein exciting the gas comprises exciting the gas in a chamber in which the semiconductor substrate is disposed.

19. A method for fabricating a semiconductor structure including a metal region, the method comprising:

heating the metal region;

exciting a gas to form a plasma, wherein the gas comprises hydrogen and carbon dioxide;

subjecting the metal region to a plasma to thereby remove material from the metal region; and forming an insulating layer overlying the metal region.

20. The method of claim 19, wherein the gas comprises about 0.1% by volume to about 10% by volume carbon dioxide.

* * * * *